United States Patent
Thadani et al.

(10) Patent No.: US 8,475,674 B2
(45) Date of Patent: Jul. 2, 2013

(54) HIGH-TEMPERATURE SELECTIVE DRY ETCH HAVING REDUCED POST-ETCH SOLID RESIDUE

(75) Inventors: Kiran V. Thadani, Sunnyvale, CA (US); Jing Tang, Santa Clara, CA (US); Nitin Ingle, San Jose, CA (US); Dongqing Yang, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 256 days.

(21) Appl. No.: 12/839,651

(22) Filed: Jul. 20, 2010

(65) Prior Publication Data
US 2011/0266252 A1 Nov. 3, 2011

Related U.S. Application Data

(60) Provisional application No. 61/330,097, filed on Apr. 30, 2010.

(51) Int. Cl.
*B44C 1/22* (2006.01)

(52) U.S. Cl.
USPC .......... 216/67; 216/37; 216/58; 216/76

(58) Field of Classification Search
USPC .......................... 216/37, 58, 67, 76
See application file for complete search history.

(56) References Cited

U.S. PATENT DOCUMENTS

| | | |
|---|---|---|
| 5,786,276 A | 7/1998 | Brooks et al. |
| 5,849,639 A | 12/1998 | Molloy et al. |
| 6,020,271 A * | 2/2000 | Yanagida ............. 438/720 |
| 2005/0230350 A1 | 10/2005 | Kao et al. |
| 2005/0266691 A1 | 12/2005 | Gu et al. |
| 2007/0099438 A1 | 5/2007 | Ye et al. |
| 2007/0108404 A1 | 5/2007 | Stewart et al. |
| 2008/0182382 A1 * | 7/2008 | Ingle et al. ............. 438/435 |
| 2009/0275206 A1 | 11/2009 | Katz et al. |

FOREIGN PATENT DOCUMENTS

WO  WO 2011/139435 A2  11/2011

OTHER PUBLICATIONS

D. Shamiryan et al. Chemical Engineering Communication, vol. 196, (2009), pp. 1475-1535.*
Notification of Transmittal of the International Search Report and the Written Opinion of the International Searching Authority, or The Declaration; International Search Report and Written Opinion of the International Searching Authority for corresponding International Application No. PCT/US2011/030582 mailed Dec. 7, 2011, 9 pages.
"Applied Siconi™ Preclean," Applied Materials, Inc., pp. 1-8, printed on Aug. 7, 2009.
"Silicon-Selective Dry Etch for Carbon-Containing Films," U.S. Appl. No. 12/551,180, filed Aug. 31, 2009.
"Smooth Siconi Etch for Silicon-Containing Films," U.S. Appl. No. 12/646,030, filed Dec. 23, 2009.

* cited by examiner

*Primary Examiner* — Lan Vinh
*Assistant Examiner* — Maki Angadi
(74) *Attorney, Agent, or Firm* — Kilpatrick Townsend & Stockton, LLP

(57) ABSTRACT

Methods of dry etching silicon-containing dielectric films are described. The methods include maintaining a relatively high temperature of the dielectric films while etching in order to achieve reduced solid residue on the etched surface. Partially or completely avoiding the accumulation of solid residue increases the etch rate.

12 Claims, 4 Drawing Sheets

HIGH-TEMPERATURE SELECTIVE DRY ETCH HAVING REDUCED POST-ETCH SOLID RESIDUE

CROSS-REFERENCES TO RELATED APPLICATIONS

This application claims the benefit of U.S. Provisional Patent Application No. 61/330,097 filed Apr. 30, 2010, and titled "CONCURRENT SUBLIMATION SICONI ETCH," which is incorporated herein by reference for all purposes.

FIELD OF THE INVENTION

This application relates to manufacturing technology solutions involving equipment, processes, and materials used in the deposition, patterning, and treatment of thin-films and coatings, with representative examples including (but not limited to) applications involving: semiconductor and dielectric materials and devices, silicon-based wafers and flat panel displays (such as TFTs).

BACKGROUND OF THE INVENTION

Integrated circuits are made possible by processes which produce intricately patterned material layers on substrate surfaces. Producing patterned material on a substrate requires controlled methods for removal of exposed material. Chemical etching is used for a variety of purposes including transferring a pattern in photoresist into underlying layers, thinning layers or thinning lateral dimensions of features already present on the surface. Often it is desirable to have an etch process which etches one material faster than another helping e.g. a pattern transfer process proceed. Such an etch process is said to be selective to the more rapidly etched material. As a result of the diversity of materials, circuits and processes, etch processes have been developed having selectivity towards a variety of materials.

Siconi™ is used to refer to a class of remote plasma assisted dry etch processes which involve the simultaneous exposure of a substrate to hydrogen- and fluorine-containing plasma effluents. Remote plasma excitation of the hydrogen and fluorine species allows substrate processing with low plasma-damage. Siconi™ etches have been developed which are largely conformal and selective towards silicon oxide layers while not readily etching silicon regardless of whether the silicon is amorphous, crystalline or polycrystalline. The selectivity provides advantages for applications such as tuning a gapfill profile, removing oxide pads and recessing oxide gapfill. Siconi™ etch processes also remove other silicon-containing dielectric layers such as silicon nitride and silicon oxynitride.

Siconi™ process, to date, produce solid by-products which grow on the surface of the substrate as substrate material is removed. These self-limiting processes etch more slowly as the solid by-products accumulate and the progress would eventually stop. The solid by-products are subsequently removed via sublimation when the temperature of the substrate is raised. Etch-sublimation cycles may be repeated to remove larger thicknesses of a silicon-containing dielectric layer.

Additional Methods are desirable which increase the effective etch rate of dielectric layers for some applications.

BRIEF SUMMARY OF THE INVENTION

Methods of dry etching silicon-containing dielectric films are described. The methods include maintaining a relatively high temperature of the dielectric films while etching in order to achieve reduced solid residue on the etched surface. Partially or completely avoiding the accumulation of solid residue increases the etch rate.

Methods of etching a silicon-containing layer on a substrate in a substrate processing region of a substrate processing chamber are described. The methods include flowing a fluorine-containing precursor and a hydrogen-containing precursor into a remote plasma region fluidly coupled to the substrate processing region while forming a plasma in the plasma region to produce plasma effluents. The methods further include etching the silicon-containing layer by flowing the plasma effluents into the substrate processing region while maintaining the substrate at a processing temperature between about 60° C. and about 160° C.

Additional embodiments and features are set forth in part in the description that follows, and in part will become apparent to those skilled in the art upon examination of the specification or may be learned by the practice of the disclosed embodiments. The features and advantages of the disclosed embodiments may be realized and attained by means of the instrumentalities, combinations, and methods described in the specification.

BRIEF DESCRIPTION OF THE DRAWINGS

A further understanding of the nature and advantages of the disclosed embodiments may be realized by reference to the remaining portions of the specification and the drawings.

DETAILED DESCRIPTION OF THE INVENTION

Methods of dry etching silicon-containing dielectric films are described. The methods include maintaining a relatively high temperature of the dielectric films while etching in order to achieve reduced solid residue on the etched surface. Partially or completely avoiding the accumulation of solid residue increases the etch rate.

Siconi™ etch processes have used a hydrogen source of ammonia ($NH_3$) and a fluorine source of nitrogen trifluoride ($NF_3$) which together flow into a remote plasma system (RPS). The plasma effluents created therein are flowed into a substrate processing region. Previously, substrate temperatures have been kept relatively low during the etching operation in order to remove a given amount of material during each etch-sublimation cycle. While performing a Siconi™ etch, solid by-products are formed at nucleation sites distributed across a substrate surface. The solid by-products grow larger as material is consumed from the top layer of the substrate. As the solid by-products grow, the etch rate is reduced and the substrate may become dimpled. A pattern loading effect may also be observed when Siconi™ etch processes are applied to patterned wafers. The size of by-products prior to sublimation has been correlated with the magnitude of the pattern loading effect which manifests itself as a larger etch rate for narrower trenches.

Figure 1:
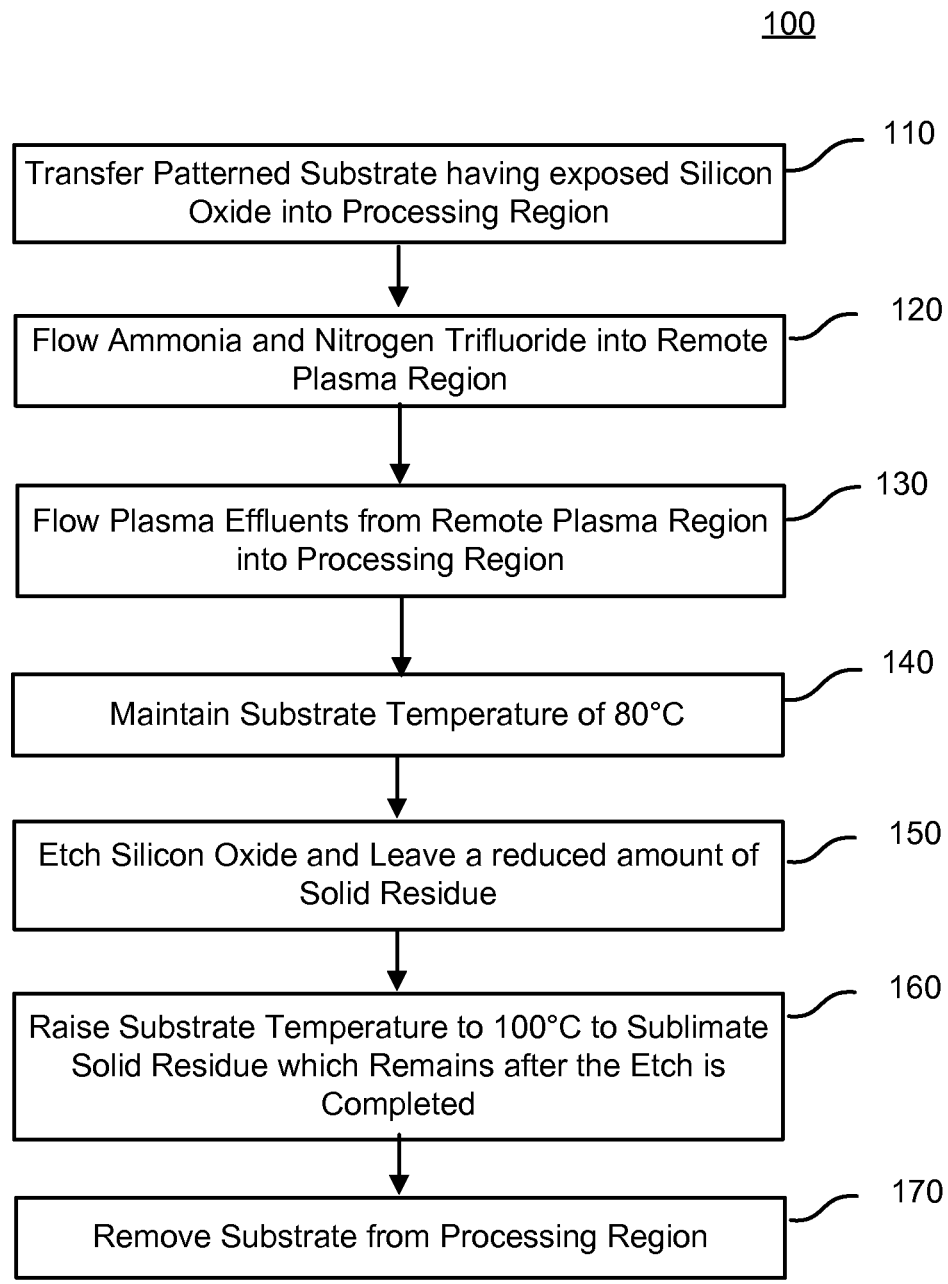
FIG. 1 is a flow chart of a silicon oxide etch process according to disclosed embodiments.

In order to better understand and appreciate the invention, reference is now made to FIG. 1 which is a flow chart 100 of a selective dry etch process applied to a patterned substrate having exposed silicon oxide. In other embodiments, the patterned substrate has exposed silicon oxynitride and/or silicon nitride. The process begins when the patterned substrate is transferred into a processing chamber (operation 110). Flows of ammonia and nitrogen trifluoride are initiated into a plasma region separate from the processing region (operation 120). The separate plasma region may be referred to as a remote plasma region herein and may be a distinct module from the processing chamber or a compartment within the processing chamber separated from the substrate processing region by a perforated plate. Plasma effluents created in the remote plasma region travel into the substrate processing region (operation 130), where they interact with the patterned substrate. The interaction forms a reduced quantity of solid residue (relative to Siconi™ etches) on the surface of the substrate. The solid residue is composed of material from both the silicon oxide and plasma effluents. The temperature of the substrate is maintained at 80° C. (operation 140) to ensure that the quantity of solid residue is reduced which increases the effective etch rate of the exposed silicon oxide.

The relatively high temperature of the substrate ensures that the solid residue grows more slowly than residue produced during a lower temperature process. The slower growth allows the etch process to proceed more deeply and/or more quickly into the silicon oxide layer. The slower growth of the solid residue also helps to maintain a higher etch rate, reduce dimpling and reduce the pattern loading effect. Generally speaking, the temperature of the silicon-containing layer during etching (operation 150) may be greater than 60° C., 65° C., 70° C., 75° C., 80° C. or 85° C., in disclosed embodiments, to reduce the quantity of solid residue present on the silicon oxide surface following the etching operation. Higher substrate temperatures increase the etch rate and enhance the other effects described which may be beneficial in many applications. On the other hand, the temperature of the silicon-containing layer during etching (operation 150) may be less than 95° C., 90° C., 85° C., 75° C. or 65° C., in disclosed embodiments, to ensure that the plasma effluents consume the silicon-containing layer at the desired rate. Any of the upper limits on the temperature of the silicon-containing layer may be combined with any of the lower limits to form additional embodiments.

The substrate is heated to sublimate the remainder of the solid by-products (operation 160). The temperature of the solid residue and the silicon oxide may be raised above the sublimation temperature, for example to one of 90° C., 95° C., 100° C., 110° C., 120° C. or 140° C., in order to sublimate the remaining solid by-products. The duration of the sublimation may be above one of 45 seconds, 60 seconds, 75 seconds, 90 seconds or 120 seconds, in disclosed embodiments. The sublimation of operation 160 occurs after the etching operation. The patterned substrate is removed from the substrate processing region (operation 170) after sublimation 160 is completed.

The choice of precursors is not limited to ammonia and nitrogen trifluoride. A variety of fluorine-containing precursors may be combined with a variety of hydrogen-containing precursors in the remote plasma region to form plasma effluents (operation 130). In general, fluorine-containing precursors may include one or more of nitrogen trifluoride ($NF_3$), hydrogen fluoride (HF), diatomic fluorine ($F_2$), monatomic fluorine (F) and fluorine-substituted hydrocarbons, in disclosed embodiments. Similarly hydrogen-containing precursor may include one or more of atomic hydrogen (H), molecular hydrogen ($H_2$), ammonia ($NH_3$), hydrazine ($N_2H_4$), a hydrocarbon and an incompletely halogen-substituted hydrocarbon, in embodiments. The flow rates of the fluorine-containing precursor and the hydrogen-containing precursor may be chosen to result in a hydrogen-to-fluorine atomic flow ratio of greater than about 0.5:1 and less than about 20:1, in disclosed embodiments. The etch rates achieved using the process parameters disclosed herein may be greater than 0.5 Å/sec, 0.7 Å/sec, 1 Å/sec, 1.5 Å/sec or 2 Å/sec, in disclosed embodiments, during etching (operation 150). The flow of precursors may be accompanied by inert carrier gases which may also be included to ignite or increase the intensity of the plasma in the remote plasma region. A flow of steam ($H_2O$) may be added into the remote plasma region along with nitrogen trifluoride ($NF_3$) to increase the concentration of HF in the remote plasma and in the plasma effluents.

Figure 2:
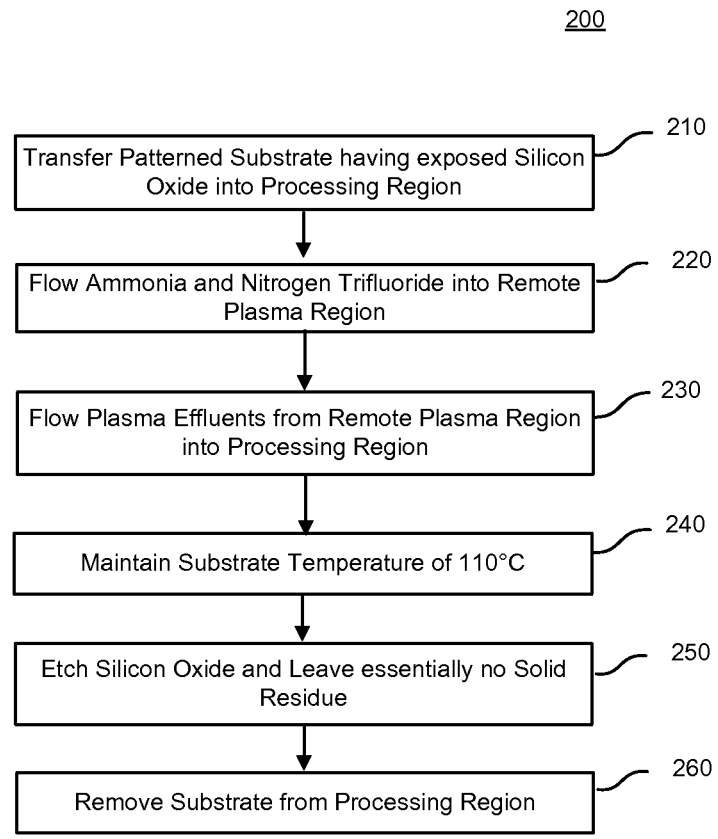
FIG. 2 is another flow chart of a silicon oxide etch process according to disclosed embodiments.

FIG. 2 is a flow chart of a silicon oxide etch process utilizing an even higher substrate temperature during the etch operation such that essentially no solid-by products are accumulated during etching. A patterned substrate is transferred into a processing chamber 210 and flows of ammonia and nitrogen trifluoride are initiated into a plasma region separate from the processing region 220. Plasma effluents created in the remote plasma region travel into the substrate processing region (operation 230) to interact with the patterned substrate. This time, the substrate temperature is maintained at 110° C. (operation 240) in order to further reduce or essentially eliminate any accumulation of solid residue during the etch 250. More generally, the temperature of the substrate during etch 250 may be greater than one of 80° C., 85° C., 90° C., 95° C. or 100° C., in embodiments, such that essentially no solid by-products remain on the surface after the etching operation. Since essentially no solid-by products are accumulated, no separate sublimation step is required, in some disclosed embodiments, before the substrate is removed from the processing region 260. To be sure, small deposits of solid-residue may remain, for example, in restricted geometries or at the edge of a processed substrate. Trace non-volatile solid-residue may also originate from impurities in the precursors or even a chamber/RPS in need of maintenance. Thus, the term "essentially" is used to allow for acceptable tolerances. Aside from process parameters associated with the unique substrate temperatures during the etch of FIG. 1, all process parameter ranges and alternative material disclosed with reference to FIG. 1 are applicable to the embodiments described with reference to FIG. 2, and vice versa. The temperature of the silicon oxide layer is less than one of 160° C., 155° C., 150° C. or 145° C. during the etching operation, in embodiments, to maintain a significant etch rate.

The methods described herein allow the removal of larger amounts of material in an individual etch operation. The etching operation may remove a thickness greater than one of 150 Å, 200 Å, 300 Å, 500 Å or 800 Å of material from a silicon-containing layer. The larger quantity of removed material raises the effective etch rate when the methods disclosed herein are implemented. In the case of patterned substrate having trenches with different widths, the difference in etch rate among trenches may be reduced. The etch rate of a silicon-containing layer from within a narrow trench may be within 10%, 5%, 3% or 2% of the etch rate within a wide trench. The width of narrow trenches may be less than one of 35 nm, 30 nm, 25 nm, 20 nm or 15 nm, in different embodiments while the width of wide trenches may be greater than one of 75 nm, 100 nm, 150 nm, 200 nm or 500 nm, in different embodiments. The term "wide trench" as used herein includes open areas or peripheral areas of integrated circuits during formation which may even be up to or much larger than tens or hundreds of microns.

During the etching operations described herein, the flow of plasma effluents into the substrate processing region can be paused to allow an accumulation of solid residue to sublimate. Since the substrate temperature can approach or exceed the sublimation temperature, in disclosed embodiments, a pause in the flow of plasma effluents into the substrate processing region may allow solid residue to sublimate. Restarting the flow of plasma effluents may then result in a renewed etch rate approaching the etch rate of the silicon-containing layer near the start of the etching operation. During the pause in flow of the plasma effluents, relatively inert gases may continue to flow into the substrate processing region and the remote plasma power may remain on. A flow of hydrogen has been maintained during the pause without adversely affecting the regenerative effects of the pause on dry etch rate. A pause in flow of plasma effluents may be effected by temporarily suspending or reducing the flows of the fluorine-containing precursor and the hydrogen-containing precursor into the remote plasma region. Pausing does not necessarily mean that these flows are eliminated. A pause may be used after the silicon-containing layer has been etched for 50 Å or 100 Å, in different embodiments. Pauses may last for a duration of greater than 1 second, 2 seconds or 5 seconds depending on the amount of solid residue which has been accumulating during the first portion of the etching operation. When etching at a relatively low substrate temperature and/or the desired etch amount is large, multiple pauses can be relatively evenly distributed within the etching operation to periodically renew the etch rate.

Additional high-temp selective dry etch process parameters are disclosed in the course of describing an exemplary processing system.

Exemplary Processing System

Figure 3:
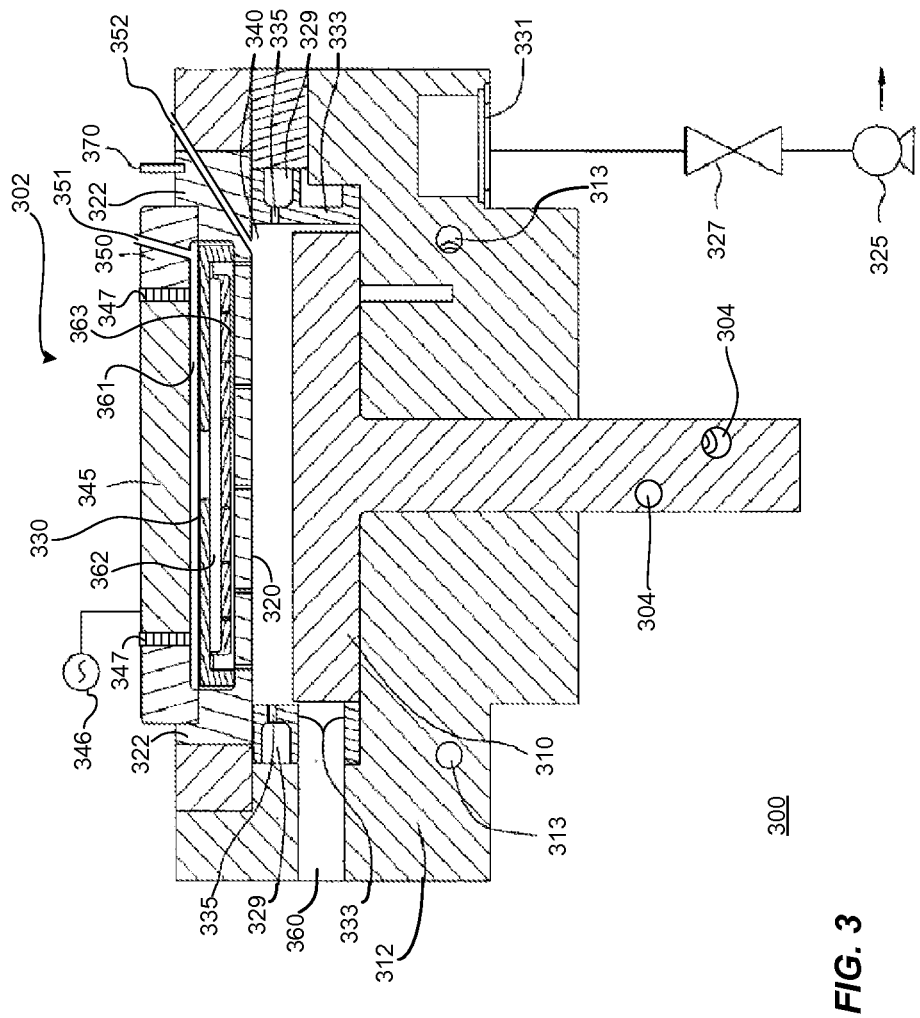
FIG. 3 is a cross-sectional view of a processing chamber for etching according to disclosed embodiments.

FIG. 3 is a partial cross sectional view showing an illustrative processing chamber 400, in which, embodiments of the invention may be carried out. Generally, a hydrogen-containing precursor and a fluorine-containing precursor may be introduced through one or more apertures 351 into remote plasma region(s) 361-363 and excited by plasma power source 346.

In one embodiment, the processing chamber 300 includes a chamber body 312, a lid assembly 302, and a support assembly 310. The lid assembly 302 is disposed at an upper end of the chamber body 312, and the support assembly 310 is at least partially disposed within the chamber body 312. The processing chamber 300 and the associated hardware are preferably formed from one or more process-compatible materials (e.g. aluminum, stainless steel, etc.).

Figure 4:
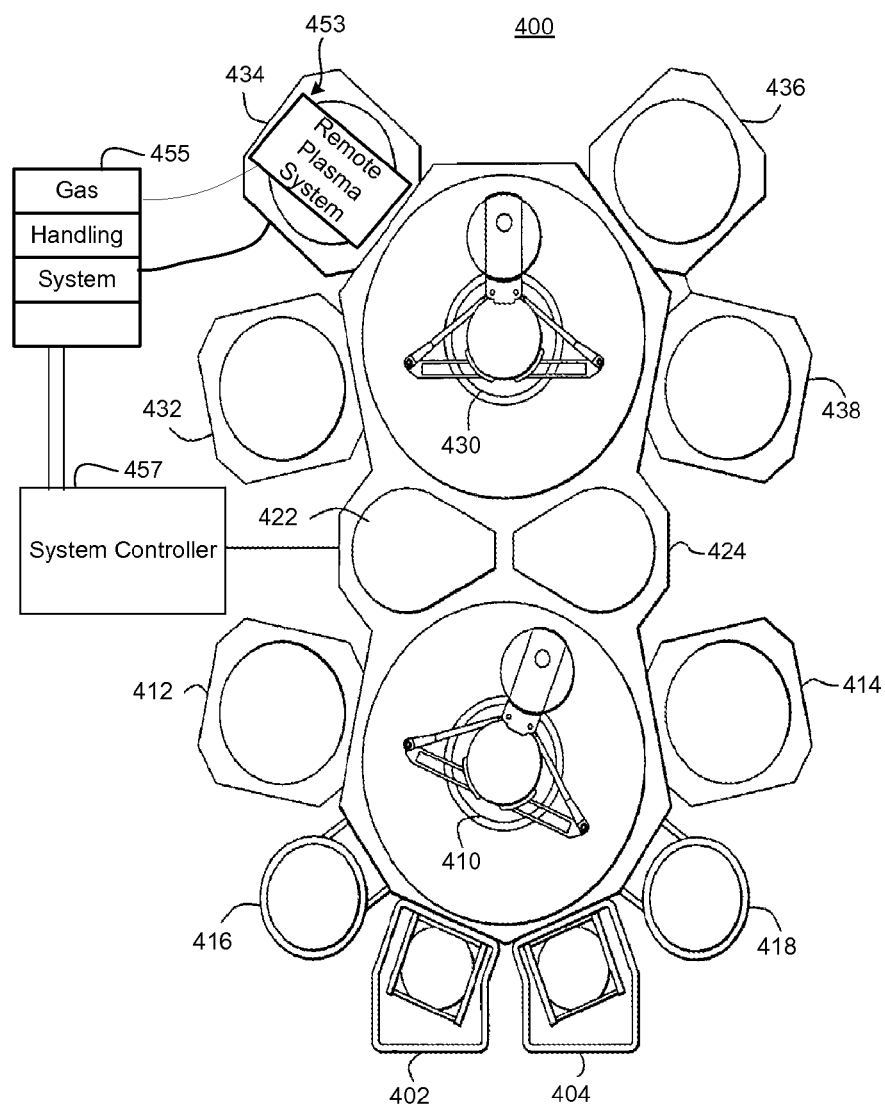
FIG. 4 is a processing system for etching according to disclosed embodiments.

The chamber body 312 includes a slit valve opening 360 formed in a sidewall thereof to provide access to the interior of the processing chamber 300. The slit valve opening 360 is selectively opened and closed to allow access to the interior of the chamber body 312 by a wafer handling robot (not shown). In one embodiment, a wafer can be transported in and out of the processing chamber 300 through the slit valve opening 360 to an adjacent transfer chamber and/or load-lock chamber, or another chamber within a cluster tool. An exemplary cluster tool which may include processing chamber 300 is shown in FIG. 4.

In one or more embodiments, chamber body 312 includes a chamber body channel 313 for flowing a heat transfer fluid through chamber body 312. The heat transfer fluid can be a heating fluid or a coolant and is used to control the temperature of chamber body 312 during processing and substrate transfer. Heating the chamber body 312 may help to prevent unwanted condensation of the gas or byproducts on the chamber walls. Exemplary heat transfer fluids include water, ethylene glycol, or a mixture thereof. An exemplary heat transfer fluid may also include nitrogen gas. Support assembly 310 may have a support assembly channel 304 for flowing a heat transfer fluid through support assembly 310 thereby affecting the substrate temperature. The relatively high substrate temperatures described herein may benefit from the use of a more direct (e.g. resistive, optical radiation) heater designed to achieve higher temperatures than a heat transfer fluid. The more direct heater may be used alone or in combination with the heat transfer fluid.

The chamber body 312 can further include a liner 333 that surrounds the support assembly 310. The liner 333 is preferably removable for servicing and cleaning. The liner 333 can be made of a metal such as aluminum, or a ceramic material. However, the liner 333 can be any process compatible material. The liner 333 can be bead blasted to increase the adhesion of any material deposited thereon, thereby preventing flaking of material which results in contamination of the processing chamber 300. In one or more embodiments, the liner 333 includes one or more apertures 335 and a pumping channel 329 formed therein that is in fluid communication with a vacuum system. The apertures 335 provide a flow path for gases into the pumping channel 329, which provides an egress for the gases within the processing chamber 300.

The vacuum system can include a vacuum pump 325 and a throttle valve 327 to regulate flow of gases through the processing chamber 300. The vacuum pump 325 is coupled to a vacuum port 331 disposed on the chamber body 312 and therefore, in fluid communication with the pumping channel 329 formed within the liner 333. The terms "gas" and "gases" are used interchangeably, unless otherwise noted, and refer to one or more reactants, catalysts, carrier, purge, cleaning, combinations thereof, as well as any other fluid introduced into the chamber body 312.

Apertures 335 allow the pumping channel 329 to be in fluid communication with a processing region 340 within the chamber body 312. The processing region 340 is defined by a lower surface of the lid assembly 302 and an upper surface of the support assembly 310, and is surrounded by the liner 333. The apertures 335 may be uniformly sized and evenly spaced about the liner 333. However, any number, position, size or shape of apertures may be used, and each of those design parameters can vary depending on the desired flow pattern of gas across the substrate receiving surface as is discussed in more detail below. In addition, the size, number and position of the apertures 335 are configured to achieve uniform flow of gases exiting the processing chamber 300. Further, the aperture size and location may be configured to provide rapid or high capacity pumping to facilitate a rapid exhaust of gas from the chamber 300. For example, the number and size of apertures 335 in close proximity to the vacuum port 331 may be smaller than the size of apertures 335 positioned farther away from the vacuum port 331.

A gas supply panel (not shown) is typically used to provide process gas(es) to the processing chamber 300 through one or more apertures 351. The particular gas or gases that are used depend upon the process or processes to be performed within the chamber 300. Illustrative gases can include, but are not limited to one or more precursors, reductants, catalysts, carriers, purge, cleaning, or any mixture or combination thereof. Typically, the one or more gases introduced to the processing chamber 300 flow into plasma volume 361 through aperture(s) 351 in top plate 350. Alternatively or in combination, processing gases may be introduced more directly through aperture(s) 352 into processing region 340. Aperture(s) 352 bypass the remote plasma excitation and are useful for processes involving gases that do not require plasma excitation or processes which do not benefit from additional excitation of the gases. Electronically operated valves and/or flow control mechanisms (not shown) may be used to control the flow of gas from the gas supply into the processing chamber 300. Depending on the process, any number of gases can be delivered to the processing chamber 300, and can be mixed either in the processing chamber 300 or before the gases are delivered to the processing chamber 300.

The lid assembly 302 can further include an electrode 345 to generate a plasma of reactive species within the lid assembly 302. In one embodiment, the electrode 445 is supported by top plate 350 and is electrically isolated therefrom by inserting electrically isolating ring(s) 347 made from aluminum oxide or any other insulating and process compatible material. In one or more embodiments, the electrode 345 is coupled to a power source 346 while the rest of lid assembly 302 is connected to ground. Accordingly, a plasma of one or more process gases can be generated in remote plasma region composed of volumes 361, 362 and/or 363 between electrode 345 and annular mounting flange 322. In embodiments, annular mounting flange comprises or supports gas delivery plate 320. For example, the plasma may be initiated and maintained between electrode 345 and one or both blocker plates of blocker assembly 330. Alternatively, the plasma can be struck and contained between the electrode 345 and gas delivery plate 320, in the absence of blocker assembly 330. In either embodiment, the plasma is well confined or contained within the lid assembly 302. Accordingly, the plasma is a "remote plasma" since the plasma is not being applied to the substrate processing region. As a result, plasma damage to the substrate may be avoided since the plasma is separated from the substrate surface.

A wide variety of power sources 346 are capable of activating the hydrogen-containing precursor (e.g. ammonia) and the nitrogen-containing precursor (nitrogen trifluoride). For example, radio frequency (RF), direct current (DC), or microwave (MW) based power discharge techniques may be used. The activation may also be generated by a thermally based technique, a gas breakdown technique, a high intensity light source (e.g., UV energy), or exposure to an x-ray source. Alternatively, a remote activation source may be used, such as a remote plasma generator, to generate a plasma of reactive species which are then delivered into the chamber 300. Exemplary remote plasma generators are available from vendors such as MKS Instruments, Inc. and Advanced Energy Industries, Inc. In the exemplary processing system an RF power supply is coupled to electrode 345. A higher-power microwave power source 346 is beneficial in the event that reactive oxygen will also be produced using power source 346.

The temperatures of the process chamber body 312 and the substrate may each be controlled by flowing a heat transfer medium through chamber body channel 313 and support assembly channel 304, respectively. Support assembly channel 304 may be formed within support assembly 310 to facilitate the transfer of thermal energy. Chamber body 312 and support assembly 310 may be cooled or heated independently. For example, a heating fluid may be flown through one while a cooling fluid is flown through the other.

Other methods may be used to control the substrate temperature. The substrate may be heated by heating the support assembly 310 (or a portion thereof, such as a pedestal) with a resistive heater or by some other means. In another configuration, gas delivery plate 320 may be maintained at a temperature higher than the substrate and the substrate can be elevated in order to raise the substrate temperature. In this case the substrate is heated radiatively or by using a gas to conduct heat from gas delivery plate 320 to the substrate. The substrate may be elevated by raising support assembly 310 or by employing lift pins. Alternatively or in combination, electromagnetic radiation may be shone onto the surface of the substrate to more directly raise the temperature of the silicon-containing film and/or the substrate.

During the etch processes described herein, chamber body 312 may be maintained within an approximate temperature range of between 50° C. and 80° C., between 55° C. and 75° C. or between 60° C. and 70° C. in different embodiments. During exposure to plasma effluents and/or oxidizing agents, the substrate may be maintained at the temperatures disclosed with reference to FIGS. 1-2.

Plasma effluents include a variety of molecules, molecular fragments and ionized species. Currently entertained theoretical mechanisms of selective dry etching may or may not be entirely correct but plasma effluents are thought to include $NH_4F$ and $NH_4F.HF$ which react readily with low temperature substrates described herein. Plasma effluents may react with a silicon oxide surface to form $(NH_4)_2SiF_6$, $NH_3$ and $H_2O$ products. Note that the $(NH_4)_2SiF_6$ solid residue, which accumulates on the substrate in some disclosed embodiments, comprises material from the substrate (Si) and material from the plasma effluents (N, H and F). The $NH_3$ and $H_2O$ are vapors under the processing conditions described herein and may be removed from processing region 340 by vacuum pump 325. A thin continuous or discontinuous layer of $(NH_4)_2SiF_6$ solid by-products may be left behind on the substrate surface, especially at the lower substrate temperatures recited herein. At higher substrate temperatures, solid by-products are not observed after the etch process has completed. Therefore, a sublimation step is not necessary in disclosed embodiments.

Following exposure of a relatively low temperature substrate to plasma effluents, solid by-products may accumulate. The substrate may be heated to remove the remaining by-products. In embodiments, the gas delivery plate 320 is heatable by incorporating heating element 370 within or near gas delivery plate 320. The substrate may be heated by reducing the distance between the substrate and the heated gas delivery plate. The gas delivery plate 320 may be heated to between about 100° C. and 150° C., between about 110° C. and 140° C. or between about 120° C. and 130° C. in different embodiments. By reducing the separation between the substrate and the heated gas delivery plate, the substrate may be heated to the temperatures disclosed with reference to FIGS. 1-2. The heat radiated from gas delivery plate 320 to the substrate should be made sufficient to dissociate or sublimate solid $(NH_4)_2SiF_6$ on the substrate into volatile $SiF_4$, $NH_3$ and HF products which may be pumped away from processing region 340. Other methods of imparting heat to the substrate may also be used. Note that the solid residue contains material from both the substrate (e.g. Si) and the precursors (N, H and F).

Nitrogen trifluoride (or another fluorine-containing precursor) may be flowed into remote plasma volume 361 at rates between about 25 sccm and about 400 sccm, between about 50 sccm and about 300 sccm or between about 100 sccm and about 200 sccm in different embodiments. Ammonia (or hydrogen-containing precursors in general) may be flowed into remote plasma volume 361 at rates between about 50 sccm and about 400 sccm, between about 100 sccm and about 350 sccm or between about 200 sccm and about 300 sccm in different embodiments. Combined flow rates of hydrogen-containing and fluorine-containing precursors into the remote plasma region may account for 0.05% to about 50% by volume of the overall gas mixture; the remainder being carrier gases supplied through the remote plasma region as well as through other inlets about the substrate processing region. In one embodiment, a purge or carrier gas is first initiated into the remote plasma region before those of the reactive gases to stabilize the pressure within the remote plasma region.

Production of the plasma effluents occurs within volumes 361, 362 and/or 363 by applying plasma power to electrode 345 relative to the rest of lid assembly 302. Plasma power can be a variety of frequencies or a combination of multiple frequencies. In the exemplary processing system the plasma is provided by RF power delivered to electrode 345. The RF power may be between about 1 W and about 1000 W, between about 5 W and about 600 W, between about 10 W and about 300 W or between about 20 W and about 100 W in different embodiments. The RF frequency applied in the exemplary processing system may be less than about 200 kHz, less than about 150 kHz, less than about 120 kHz or between about 50 kHz and about 90 kHz in different embodiments.

Processing region 340 can be maintained at a variety of pressures during the flow of ozone, oxygen, carrier gases and/or plasma effluents into processing region 340. The pressure may be maintained between about 500 mTorr and about 30 Torr, between about 1 Torr and about 10 Torr or between about 3 Torr and about 6 Torr in different embodiments. Lower pressures may also be used within processing region 340. The pressure may be maintained below or about 500 mTorr, below or about 250 mTorr, below or about 100 mTorr, below or about 50 mTorr or below or about 20 mTorr in different embodiments.

In one or more embodiments, the processing chamber 300 can be integrated into a variety of multi-processing platforms, including the Producer™ GT, Centura™ AP and Endura™ platforms available from Applied Materials, Inc. located in Santa Clara, Calif. Such a processing platform is capable of performing several processing operations without breaking vacuum.

FIG. 4 is a schematic top-view diagram of an illustrative multi-chamber processing system 400. The system 400 can include one or more load lock chambers 402, 404 for transferring of substrates into and out of the system 400. Typically, since the system 500 is under vacuum, the load lock chambers 402, 404 may "pump down" the substrates introduced into the system 400. A first robot 410 may transfer the substrates between the load lock chambers 402, 404, and a first set of one or more substrate processing chambers 412, 414, 416, 418 (four are shown). Each processing chamber 412, 414, 416, 418, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The first robot 410 can also transfer substrates to/from one or more transfer chambers 422, 424. The transfer chambers 422, 424 can be used to maintain ultrahigh vacuum conditions while allowing substrates to be transferred within the system 400. A second robot 430 can transfer the substrates between the transfer chambers 422, 424 and a second set of one or more processing chambers 432, 434, 436, 438. Similar to processing chambers 412, 414, 416, 418, the processing chambers 432, 434, 436, 438 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 412, 414, 416, 418, 432, 434, 436, 438 may be removed from the system 400 if not necessary for a particular process to be performed by the system 400.

A remote plasma system (RPS) 453 may be positioned remotely or integrated (as shown) with the selective dry etch processing chamber 434. Alternatively, the RPS 453 may be a separate from but in close proximity or even physically attached to processing chamber 434. The process gases from gas handling system 455 are introduced through apertures 351, excited by remote plasma(s) within process volumes 361, 362 and/or 363.

System controller 457 is used to control motors, valves, flow controllers, power supplies and other functions required to carry out process recipes described herein. System controller 457 may rely on feedback from optical sensors to determine and adjust the position of movable mechanical assemblies. Mechanical assemblies may include the robot, throttle valves and susceptors which are moved by motors under the control of system controller 457.

In an exemplary embodiment, system controller 457 includes a hard disk drive (memory), USB ports, a floppy disk drive and a processor. System controller 457 includes analog and digital input/output boards, interface boards and stepper motor controller boards. Various parts of multi-chamber processing system 400 which contains processing chamber 300 are controlled by system controller 457. The system controller executes system control software in the form of a computer program stored on computer-readable medium such as a hard disk, a floppy disk or a flash memory thumb drive. Other types of memory can also be used. The computer program includes sets of instructions that dictate the timing, mixture of gases, chamber pressure, chamber temperature, RF power levels, susceptor position, and other parameters of a particular process.

A process for etching, depositing or otherwise processing a film on a substrate or a process for cleaning chamber can be implemented using a computer program product that is executed by the controller. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

The interface between a user and the controller may be via a touch-sensitive monitor and may also include a mouse and keyboard. In one embodiment two monitors are used, one mounted in the clean room wall for the operators and the other behind the wall for the service technicians. The two monitors may simultaneously display the same information, in which case only one is configured to accept input at a time. To select a particular screen or function, the operator touches a designated area on the display screen with a finger or the mouse. The touched area changes its highlighted color, or a new menu or screen is displayed, confirming the operator's selection.

As used herein "substrate" may be a support substrate with or without layers formed thereon. The support substrate may be an insulator or a semiconductor of a variety of doping concentrations and profiles and may, for example, be a semiconductor substrate of the type used in the manufacture of integrated circuits. "Silicon oxide" may include minority concentrations of other elemental constituents such as nitrogen, hydrogen, carbon and the like. The term "precursor" is used to refer to any process gas which takes part in a reaction to either remove material from or deposit material onto a surface. A gas may be a combination of two or more gases. The term "trench" is used throughout with no implication that the etched geometry has a large horizontal aspect ratio. Viewed from above the surface, trenches may appear circular, oval, polygonal, rectangular, or a variety of other shapes.

Having disclosed several embodiments, it will be recognized by those of skill in the art that various modifications, alternative constructions, and equivalents may be used without departing from the spirit of the disclosed embodiments. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a process" includes a plurality of such processes and reference to "the dielectric material" includes reference to one or more dielectric materials and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of etching a silicon-containing layer on a substrate in a substrate processing region of a substrate processing chamber, the method comprising:
    flowing a fluorine-containing precursor and a hydrogen-containing precursor into a remote plasma region fluidly coupled to the substrate processing region while forming a plasma in the plasma region to produce plasma effluents; and
    etching the silicon-containing layer by flowing the plasma effluents into the substrate processing region while maintaining the substrate at a processing temperature between about 60° C. and about 95° C.; and
    pausing the flow of the plasma effluents into the substrate processing region to allow accumulated solid residue to sublimate and then restarting the flow of the plasma effluents to continue etching the same silicon-containing layer with a renewed etch rate at the processing temperature between about 60° C. and about 95° C.

2. The method of claim 1 wherein the fluorine-containing precursor comprises at least one precursor selected from the group consisting of nitrogen trifluoride, hydrogen fluoride, diatomic fluorine, monatomic fluorine and fluorine-substituted hydrocarbons.

3. The method of claim 1 wherein the hydrogen-containing precursor comprises at least one precursor selected from the group consisting of atomic hydrogen, molecular hydrogen, ammonia, hydrazine, a hydrocarbon and an incompletely halogen-substituted hydrocarbon.

4. The method of claim 1 further comprising flowing steam ($H_2O$) into the remote plasma region during the operation of flowing the fluorine-containing precursor into the remote plasma region.

5. The method of claim 1 wherein the silicon-containing layer comprises one of silicon oxide, silicon oxynitride or silicon nitride.

6. The method of claim 1 wherein the etching operation removes more than 300 Å of material from the silicon-containing layer.

7. The method of claim 1 wherein the substrate is a patterned substrate having a narrow trench having a narrow width and a wide trench having a wide width and a etch rate of the silicon-containing film within the narrow trench is within 10% of the etch rate within the wide trench.

8. The method of claim 7 wherein the narrow width is less than 35 nm and the wide width is greater than 75 nm.

9. The method of claim 7 wherein the wide trench is in one of an open area or a peripheral area of an integrated circuit during fabrication.

10. The method of claim 1 wherein a temperature of the silicon-containing layer is less than 150° C. during the etching operation.

11. The method of claim 1 wherein the silicon-containing layer is heated by a substrate support pedestal during the etching operation.

12. The method of claim 1 wherein the silicon-containing layer is heated using electromagnetic radiation during the etching operation.

* * * * *